(12) United States Patent
Wang

(10) Patent No.: US 10,732,204 B2
(45) Date of Patent: Aug. 4, 2020

(54) LARGE-CAPACITANCE INSULATING CORE, HIGH-VOLTAGE ELECTRICAL APPLIANCE AND MULTI-FUNCTIONAL HIGH-VOLTAGE BUSHING

(71) Applicant: BEIJING RUIHENG XINYUAN INVESTMENT CO., LTD, Beijing (CN)

(72) Inventor: Huan Wang, Beijing (CN)

(73) Assignee: BEIJING RUIHENG XINYUAN INVESTMENT CO., LTD (CN)

( * ) Notice: Subject to any disclaimer, the term of this patent is extended or adjusted under 35 U.S.C. 154(b) by 155 days.

(21) Appl. No.: 16/080,111

(22) PCT Filed: Oct. 21, 2016

(86) PCT No.: PCT/CN2016/102827
§ 371 (c)(1),
(2) Date: Aug. 27, 2018

(87) PCT Pub. No.: WO2017/148159
PCT Pub. Date: Sep. 8, 2017

(65) Prior Publication Data
US 2019/0056431 A1    Feb. 21, 2019

(30) Foreign Application Priority Data
Feb. 29, 2016   (CN) .......................... 2016 1 0112498

(51) Int. Cl.
*G01R 15/06* (2006.01)
*H01G 4/30* (2006.01)
(Continued)

(52) U.S. Cl.
CPC ............. *G01R 15/06* (2013.01); *H01B 17/28* (2013.01); *H01G 4/005* (2013.01); *H01G 4/30* (2013.01); *H01G 4/38* (2013.01)

(58) Field of Classification Search
CPC . G01R 15/06; H01G 4/30; H01G 4/38; H01G 4/005; H01G 4/012; H01G 4/385; H01B 17/28

See application file for complete search history.

(56) References Cited

U.S. PATENT DOCUMENTS

| 8,907,223 | B2 * | 12/2014 | Johansson | H01B 17/28 174/143 |
| 2008/0179077 | A1 * | 7/2008 | Krivda | H01B 17/28 174/152 R |

(Continued)

FOREIGN PATENT DOCUMENTS

| CN | 202601421 U | 12/2012 |
| CN | 205050651 U | 2/2016 |

(Continued)

OTHER PUBLICATIONS

International Search Report dated Feb. 4, 2017 in corresponding PCT International Application No. PCT/CN2016/102827.

(Continued)

*Primary Examiner* — Son T Le
(74) *Attorney, Agent, or Firm* — Ostrolenk Faber LLP

(57) ABSTRACT

A large-capacitance insulating core, a high-voltage electrical appliance and a multi-functional high-voltage bushing. The insulating core is internally provided with a capacitance increasing structure. The capacitance increasing structure is a plurality of capacitive screen sets formed by a forward capacitive screen set and a reverse capacitive screen set that are alternatively arranged and in parallel connection. The forward capacitive screen set includes a plurality of capacitive screens arranged alternatively with insulating layers, an innermost capacitive screen of the forward capacitive screen set is connected to a high potential, and an outermost capacitive screen is connected to a low potential. The reverse capacitive screen set includes a plurality of capaci- (Continued)

tive screens arranged alternatively with insulating layers, an innermost capacitive screen of the reverse capacitive screen set is connected to a low potential, and an outermost capacitive screen is connected to a high potential; and an innermost capacitive screen set and an outermost capacitive screen set in the plurality of capacitive screen sets of the capacitance increasing structure are both the forward capacitive screen sets, and can satisfy the voltage-sharing and large-capacitance requirements simultaneously. The high-voltage electrical appliance and the multi-functional high-voltage bushing include the large-capacitance insulating core.

10 Claims, 7 Drawing Sheets

(51) Int. Cl.
*H01B 17/28* (2006.01)
*H01G 4/38* (2006.01)
*H01G 4/005* (2006.01)

(56) References Cited

U.S. PATENT DOCUMENTS

| 2010/0206604 | A1* | 8/2010 | Rocks | H01B 17/28 174/73.1 |
| 2015/0325341 | A1* | 11/2015 | Hedlund | H01G 4/32 174/143 |
| 2017/0309398 | A1* | 10/2017 | Wang | H01F 27/28 |

FOREIGN PATENT DOCUMENTS

CN 205723019 U 11/2016
EP 2 431 983 A1 3/2012

OTHER PUBLICATIONS

Written Opinion dated Feb. 4, 2017 in corresponding PCT International Application No. PCT/CN2016/102827.

* cited by examiner

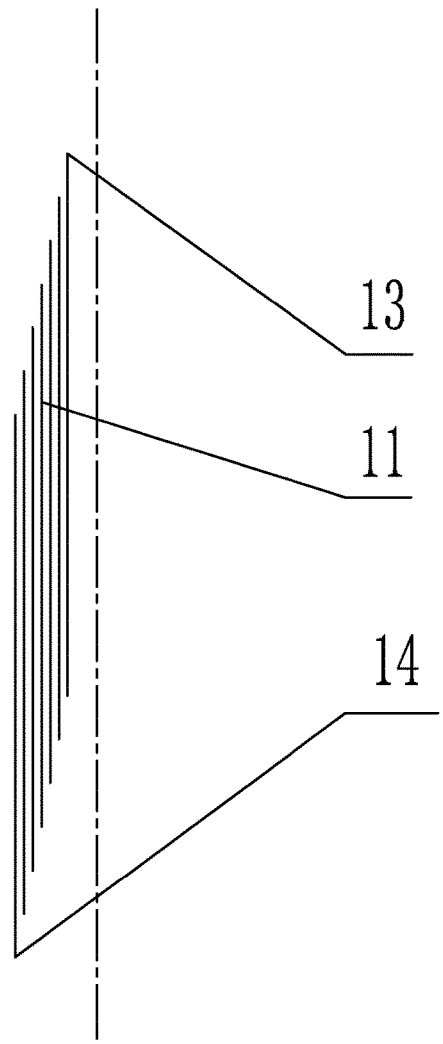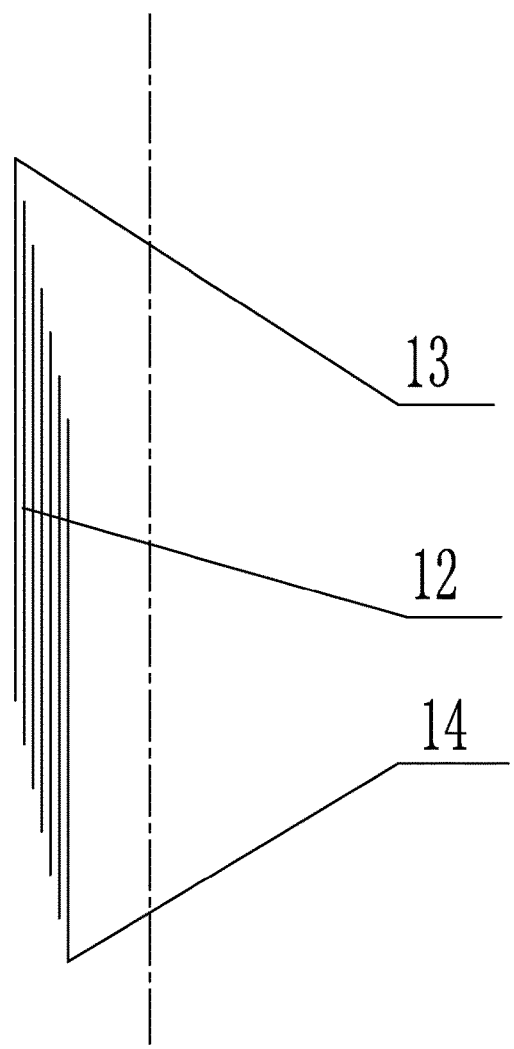
Fig 2                               Fig 3

LARGE-CAPACITANCE INSULATING CORE, HIGH-VOLTAGE ELECTRICAL APPLIANCE AND MULTI-FUNCTIONAL HIGH-VOLTAGE BUSHING

CROSS-REFERENCE TO RELATED APPLICATIONS

The present application is a 35 U.S.C. §§ 371 national phase conversion of PCT/CN2016/102827, filed Oct. 21, 2016, which claims priority to Chinese Patent Application No. 201610112498.X, filed Feb. 29, 2016, the contents of which are incorporated herein by reference. The PCT International Application was published in the Chinese language.

TECHNICAL FIELD

The present invention belongs to the field of high-voltage electrical appliance, and relates to a large-capacitance insulating core, a high-voltage electrical appliance with the large-capacitance insulating core and a multi-functional high-voltage bushing.

BACKGROUND ART

In order to improve insulation levels of a high-voltage electrical appliance, such as a transformer bushing, a wall bushing, a cable terminal, a transformer, an insulated busbar and other capacitive insulating cores, a plurality of coaxial capacitive screens are generally used in an insulation structure to play a role of balancing an electric field, the innermost layer is connected to a high-voltage potential, and the outermost layer is connected to a low-voltage potential or a ground potential to form a capacitance voltage-sharing core with a plurality of capacitive screens in series.

For many years, the skilled in the art is trying to use this high-voltage capacitor to draw energy from the power grid, which is used as a power supply of low-voltage appliance, or replaces the voltage transformer to measure the high voltage, or detects an insulation state of the high-voltage electrical appliance, etc., thereby having larger effect in an intelligent power grid. However, the capacities of the capacitors in series are relatively small, i.e., epoxy resin can only reach 1000 to 1500 pF using as a medium, the drawn energy drown is small (tens of milliamps to hundred milliamps), is easy to be interfered by the electric field, and is difficult to meet the requirement above.

SUMMARY OF THE INVENTION

The present invention aims at overcoming the deficiency of the prior art and provides a new-type large-capacitance insulating core, a high-voltage electrical appliance with the large-capacitance insulating core, and a multi-functional high-voltage bushing.

In order to achieve the above object, the present invention adopts the following technical solutions.

The present invention provides a large-capacitance insulating core, the insulating core is internally provided with a capacitance increasing structure 10, and the capacitance increasing structure 10 is a plurality of capacitive screen sets formed by a forward capacitive screen set 11 and a reverse capacitive screen set 12 that are alternatively arranged and in parallel connection; the forward capacitive screen set 11 comprises a plurality of capacitive screens arranged alternatively with insulating layers, an innermost capacitive screen of the forward capacitive screen set 11 is connected to a high potential, and an outermost capacitive screen is connected to a low potential; the reverse capacitive screen set 12 comprises a plurality of capacitive screens arranged alternatively with insulating layers, an innermost capacitive screen of the reverse capacitive screen set 12 is connected to a low potential, and an outermost capacitive screen is connected to a high potential; and an innermost capacitive screen set and an outermost capacitive screen set in the plurality of capacitive screen sets of the capacitance increasing structure 10 are both the forward capacitive screen sets 11.

Preferably, the plurality of capacitive screen sets of the capacitance increasing structure 10 are coaxially and concentrically arranged, and the plurality of capacitive screens of the forward capacitive screen set 11 and the plurality of capacitive screens of the reverse capacitive screen set 12 are all cylinders that are coaxially and concentrically arranged.

Preferably, the capacitive screens in all capacitive screen sets of the capacitance increasing structure 10 connected to the high potential are electrically connected to each other, and the capacitive screens in all capacitive screen sets of the capacitance increasing structure 10 connected to the low potential are electrically connected to each other.

Preferably, the plurality of coaxially and concentrically arranged capacitive screens of the forward capacitive screen set 11 gradually offset from one end to the other end of the insulating core in a ladder-like way along an axial direction from inside to outside; and the plurality of coaxially and concentrically arranged capacitive screens of the reverse capacitive screen set 12 gradually offset from the other end to one end of the insulating core in a ladder-like way along an axial direction from inside to outside.

Preferably, one or a plurality of capacitance increasing structures 10 are arranged in an axial direction of the insulating core.

Preferably, the insulating core is provided with a grounding flange, two capacitance increasing structures 10 are arranged in an axial direction of the insulating core, and the two capacitance increasing structures 10 are respectively located on two sides of the grounding flange; and the plurality of capacitive screen sets of the two capacitance increasing structures 10 are also in parallel connection with each other.

The present invention further provides a capacitive type high-voltage electrical appliance comprising the large-capacitance insulating core of the present invention.

Preferably, the capacitance increasing structure 10 of the insulating core forms a main capacitor, the high-voltage electrical appliance further comprises a voltage-dividing capacitor, the main capacitor and the voltage-dividing capacitor form a capacitive voltage divider in series.

Preferably, the high-voltage electrical appliance is a transformer bushing, a wall bushing, a cable terminal, a voltage transformer, a current transformer, a coupling capacitors or an insulated busbar.

The present invention further provides a multi-functional high-voltage bushing comprising a vacuum interrupter, the vacuum interrupter is covered with the large-capacitance insulating core of the present invention, two connecting terminals are located at two ends of the insulating core, the two connecting terminals are electrically connected to a contact in the vacuum interrupter respectively, an operating mechanism can drive the contact in the vacuum interrupter to close and break, so as to realize the closing and breaking of a line; and the multi-functional high-voltage bushing further comprises a voltage-dividing capacitor, main capacitors formed by a capacitance increasing structure 10 in the insulating core and the voltage-dividing capacitor form a capacitive voltage divider in series, and the capacitive voltage divider is used to supply power to the operating mechanism.

The large-capacitance insulating core of the present invention increases the capacitance of the insulating core through the plurality of capacitive screen sets formed by the forward capacitive screen set and the reverse capacitive screen set that are alternatively arranged and in parallel connection, which can multiply the capacitance capacity, can satisfy the voltage-sharing and large-capacitance requirements of the high-voltage electrical appliance simultaneously, and can be used in the insulating cores of the high-voltage electrical appliance such as the transformer bushing, the wall bushing, the cable terminal, the transformer, and the insulation busbar. The voltage-sharing effect of the capacitive screen of the insulating core can increase an insulation level of the high-voltage electrical appliance; and when the capacitance of the insulating core is increased, more electric power can be obtained from a high-voltage power grid, the power of available electric energy is greatly increased, with the advantages of low cost and high anti-interference performance, and the larger the capacitance of the insulating core is, the higher the electric energy obtained from a high-voltage end is, and the wider the application range is.

BRIEF DESCRIPTION OF THE DRAWINGS

FIG. 2 is a schematic diagram illustrating a structure of a forward capacitive screen set in an upper part of FIG. 1;

FIG. 3 is a schematic diagram illustrating a structure of a reverse capacitive screen set in an upper part of FIG. 1;

DETAILED DESCRIPTION OF THE PREFERRED EMBODIMENTS

The detailed embodiments of the large-capacitance insulating core of the present invention are further described hereinafter with reference to the embodiments shown in FIGS. 1 to 5. The large-capacitance insulating core of the present invention is not limited to the description of the following embodiments.

Regarding to a large-capacitance insulating core, the insulating core is internally provided with a capacitance increasing structure 10, the capacitance increasing structure 10 is a plurality of capacitive screen sets formed by a forward capacitive screen set 11 and a reverse capacitive screen set 12 that are alternatively arranged and in parallel connection; the forward capacitive screen set 11 comprises a plurality of capacitive screens arranged alternatively with insulating layers, an innermost capacitive screen of the forward capacitive screen set 11 is connected to a high potential, and an outermost capacitive screen is connected to a low potential; the reverse capacitive screen set 12 comprises a plurality of capacitive screens arranged alternatively with insulating layers, an innermost capacitive screen of the reverse capacitive screen set 12 is connected to a low potential, and an outermost capacitive screen is connected to a high potential; and an innermost capacitive screen set and an outermost capacitive screen set in the plurality of capacitive screen sets of the capacitance increasing structure 10 are both the forward capacitive screen sets 11. The large-capacitance insulating core of the present invention increases the capacitance of the insulating core through the plurality of capacitive screen sets formed by the forward capacitive screen set and the reverse capacitive screen set that are alternatively arranged and in parallel connection, which can satisfy the voltage-sharing and large-capacitance requirements of the high-voltage electrical appliance simultaneously. It can be used in insulating cores of high-voltage electrical appliances such as a transformer bushing, a wall bushing, a cable terminal, a voltage transformer, a current transformer, a coupling capacitor, and an insulation busbar. The large-capacitance insulating core of the present invention is further described with reference to the first to Embodiment fours hereinafter.

Embodiment One

Figure 1:
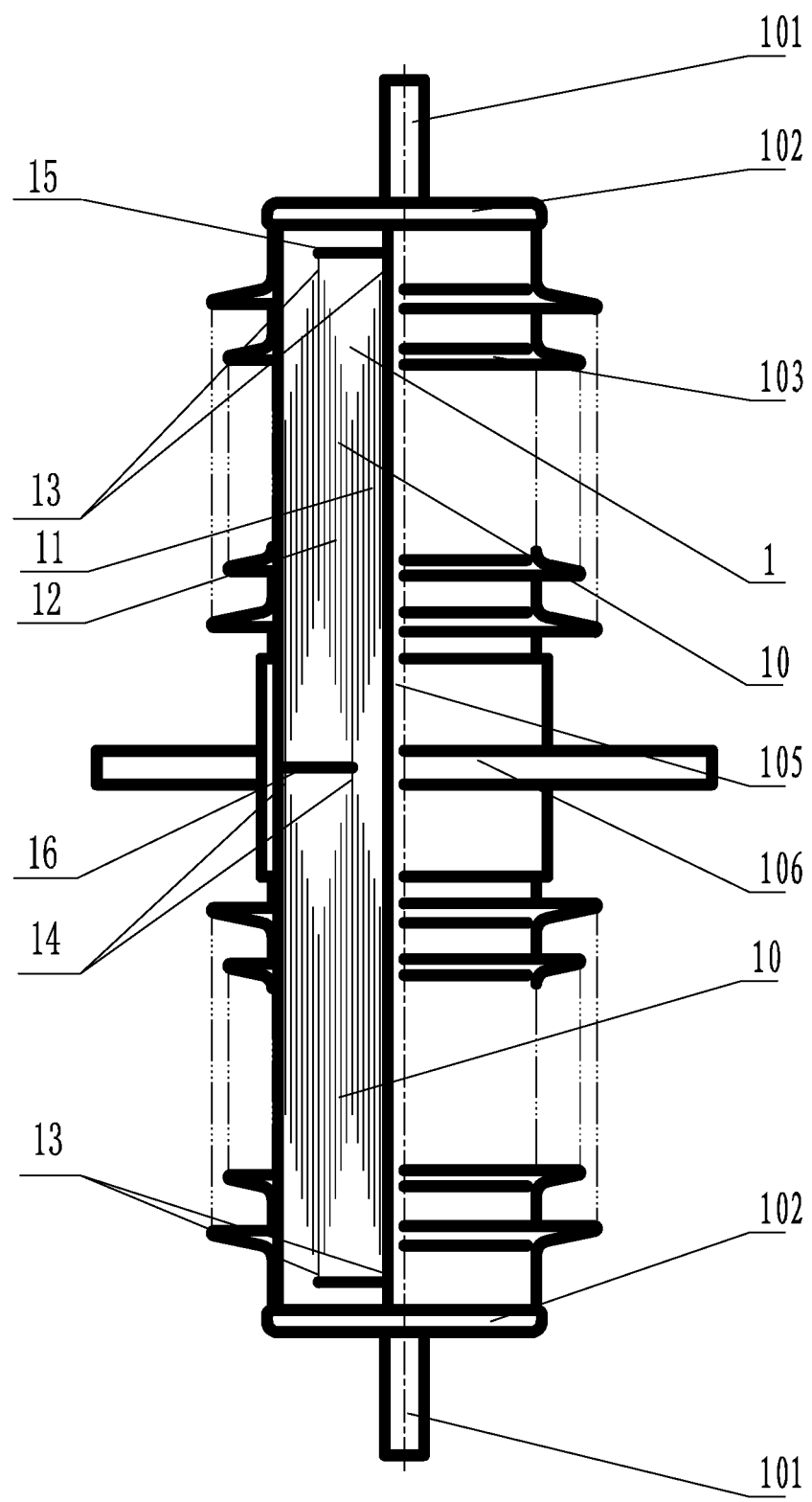
FIG. 1 is schematic diagram illustrating a structure of an embodiment of a high-voltage bushing of a large-capacitance insulating core according to the present invention.

As shown in FIG. 1, regarding to a high-voltage bushing of a large-capacitance insulating core, the high-voltage bushing comprises a current-carrying conductor 105, an insulating core 1 sleeved outside the current-carrying conductor 105, end flanges 102 located at two ends of the insulating core 1, and a silicon rubber shed 103 sleeved outside the insulating core 1; two ends of the insulating core 1 are provided with the end flanges 102, the end flange 102 is connected to the current-carrying conductor 105, and the current-carrying conductor 105 is led out through a connecting terminal 101; and a middle portion of the insulating core 1 is provided a grounding flange 106, the grounding flange 106 is used for grounding and can also be used for the installing the high-voltage bushing. The insulating core 1 is internally provided with a capacitance increasing structure 10, the capacitance increasing structure 10 is a plurality of capacitive screen sets formed by a forward capacitive screen set 11 and a reverse capacitive screen set 12 that are alternatively arranged and in parallel connection, the forward capacitive screen set 11 comprises a plurality of capacitive screens arranged alternatively with insulating layers, an innermost capacitive screen of the forward capacitive screen set 11 is connected to a high potential, and an outermost capacitive screen is connected to a low potential (grounding is available too); the reverse capacitive screen set 12 comprises a plurality of capacitive screens arranged alternatively with insulating layers, an innermost capacitive screen of the reverse capacitive screen set 12 is connected to a low potential (grounding is available too), and an outermost capacitive screen is connected to a high potential; and an innermost capacitive screen set and an outermost capacitive screen set in the plurality of capacitive screen sets of the capacitance increasing structure 10 are both the forward capacitive screen sets 11.

The insulating core of the present invention shares the voltage through the plurality of capacitive screens of each capacitive screen set and increases the capacitance of the insulating core through the plurality of capacitive screen sets formed by the forward capacitive screen set 11 and the reverse capacitive screen set 12 that are alternatively arranged and in parallel connection, which can satisfy the voltage-sharing and large-capacitance requirements of the high-voltage electrical appliance simultaneously. The voltage-sharing effect of the capacitive screen of the insulating core is to share an electric field strength in an insulating structure, and increase an insulating level; and when the capacitance of the insulating core is increased, more electric power can be obtained from a high-voltage power grid, the power of available electric energy is greatly increased, with the advantages of low cost and high anti-interference performance, and the larger the capacitance of the insulating core is, the higher the electric energy obtained from a high-voltage end is, and the wider the application range is.

Specifically, the structure of the capacitance increasing structure 10 refers to FIG. 1 to FIG. 3. As shown in FIG. 1, the capacitance increasing structure 10 comprises the forward capacitive screen set 11 and the reverse capacitive screen set 12 that are alternatively arranged, the number of alternating times is determined according to the required capacity, but the innermost capacitive screen set shall be the forward capacitive screen set 11, and the outermost capacitive screen set shall still be the forward capacitive screen set 11, so as to ensure the insulating strength of an outer surface of the insulating core.

As shown in FIG. 2, the forward capacitive screen set 11 comprises a plurality of capacitive screens alternately arranged with insulating layers, the number and the position of the capacitive screen, and the thickness of the insulating layer between the capacitive screens can be different, and are determined according to application. The innermost capacitive screen in the forward capacitive screen set 11 is a capacitive screen 13 connected to the high potential, and the outermost capacitive screen is a capacitive screen 14 connected to the low potential. Further, the plurality of coaxially and concentrically arranged capacitive screens of the forward capacitive screen set 11 gradually offset from one end to the other end of the insulating core in a ladder-like way along an axial direction from inside to outside, so that an electric field is evenly distributed, the size and the position of each capacitive screen are determined by insulation calculation, a length of each capacitive screen is not necessarily the same, a step difference of each capacitive screen is not necessarily equal, and upper and lower step differences of the capacitive screen are not necessarily equal either.

As shown in FIG. 3, the reverse capacitive screen set 12 comprises a plurality of capacitive screens alternately arranged with insulating layers, the number and the position of the capacitive screen, and the thickness of the insulating layer between the capacitive screens can be different, and are determined according to application. The innermost capacitive screen in the reverse capacitive screen set 12 is a capacitive screen 14 connected to the low potential, and the outermost capacitive screen is a capacitive screen 13 connected to the high potential. Further, the plurality coaxially and concentrically arranged capacitive screens of the reverse capacitive screen set 12 gradually offset from the other end to one end of the insulating core in a ladder-like way along an axial direction from inside to outside, so that the voltage is evenly distributed, the size and position of each capacitive screen are determined by the insulation calculation, the length of each capacitive screen is not necessarily the same, the step difference of each capacitive screen is not necessarily equal, and the upper and lower step differences of the capacitive screen are not necessarily equal either.

Further, the plurality of capacitive screen sets of the capacitance increasing structure 10 are coaxially and concentrically arranged, the plurality of capacitive screens of the forward capacitive screen set 11 and the plurality of capacitive screens of the reverse capacitive screen set 12 are cylinders that are coaxially and concentrically arranged, and the capacitive screens of the plurality of capacitive screen sets are all cylinders that are coaxially and concentrically arranged according to the current-carrying conductor. The capacitive screens in all capacitive screen sets of the capacitance increasing structure 10 connected to the high potential are connected through a high-voltage potential connecting line 15 at a position close to the end flange 102 and are electrically connected to a high-voltage potential, the capacitive screens in all capacitive screen sets of the capacitance increasing structure 10 connected to the low potential are connected through a low potential connecting line 16 at a position close to the grounding flange 106 and are connected to a low potential position, the capacitive screens in all capacitive screen sets connected to the high potential are electrically connected to each other, and the capacitive screens connected to the low potential are electrically connected to each other, so that all forward capacitive screen sets and reverse capacitive screen sets form a parallel connection structure.

Further, in the insulating core 1 of the high-voltage bushing of the embodiment is internally provided with two capacitance increasing structures 10, and the two capacitance increasing structures 10 are respectively located on two sides of the grounding flange 106. Each capacitance increasing structure 10 comprises the forward capacitive screen set 11 and the reverse capacitive screen set 12 that are alternatively arranged, and a plurality of capacitive screen sets of the two capacitance increasing structures 10 are also in parallel connection with each other. Certainly, a capacitance increasing structure 10 can be arranged on in an axial direction of the insulating core according to the application requirement, and a plurality of capacitance increasing structures 10 can also be arranged. In the embodiment, the two capacitance increasing structures 10 of the high-voltage bushing both comprise three capacitive screen sets, the three capacitive screen sets are, from an inner side to an outer side, the forward capacitive screen set 11, the reverse capacitive screen set 12 and the forward capacitive screen set 11 respectively, i.e., the capacitance increasing structure 10 comprises odd-numbered capacitive screen sets, the innermost capacitive screen set shall be the forward capacitive screen set 11, and the outermost capacitive screen set shall still be the forward capacitive screen set 11; The two capacitance increasing structures 10 form an approximately symmetrically arranged structure by the grounding flange 106, and the two capacitance increasing structures 10 also form a parallel connection structure. According to different application requirements, the number of alternating times of the forward capacitive screen set 11 and the reverse capacitive screen set 12 in the capacitance increasing structures 10 on two sides of the grounding flange 106 can be different, and the size and the position of the capacitive screen set in the capacitance increasing structures 10 on two sides can be different, and a parallel connection structure is also formed between the capacitors formed by a plurality of capacitive screen sets on two sides.

In addition, in adjacent forward capacitive screen set 11 and reverse capacitive screen set 12, the outermost capacitive screen 14 of the forward capacitive screen set 11 connected to the low potential and innermost capacitive screen 14 of the reverse capacitive screen set 12 connected to the low potential can share a capacitive screen, or can also be independent capacitive screens connected to each other. The outermost capacitive screen 13 of the reverse capacitive screen set 12 connected to the high potential and the innermost capacitive screen 13 of the forward capacitive screen set 11 connected to the high potential can share a capacitive screen, and can also be independent capacitive screens connected to each other.

According to different applications of the high-voltage bushing of the embodiment, the current-carrying conductor 105 can be a conductive rod, a wire, or a conductive tube; the end flanges 102 at two ends of the insulating core 1 can be voltage-sharing flanges; the connecting terminal at one end of the insulating core 1 can also be a voltage-sharing ball or a voltage-sharing ring; and a silicon rubber shed 103 is sleeved outside the insulating core 1 as the external insulation, which can also be a porcelain sleeve. The high-voltage bushing can also comprise two insulating cores, each insulating cores is internally provided with a capacitance increasing structure 10, the two insulating cores are sleeved at two ends of the current-carrying conductor, and flange coupling is additionally installed between the grounding flanges, which all fall in the protection scope of the present invention. The capacitive screens in the insulating core are a set of coaxial cylindrical metals or semiconductor capacitive screens.

Embodiment Two

Figure 4:
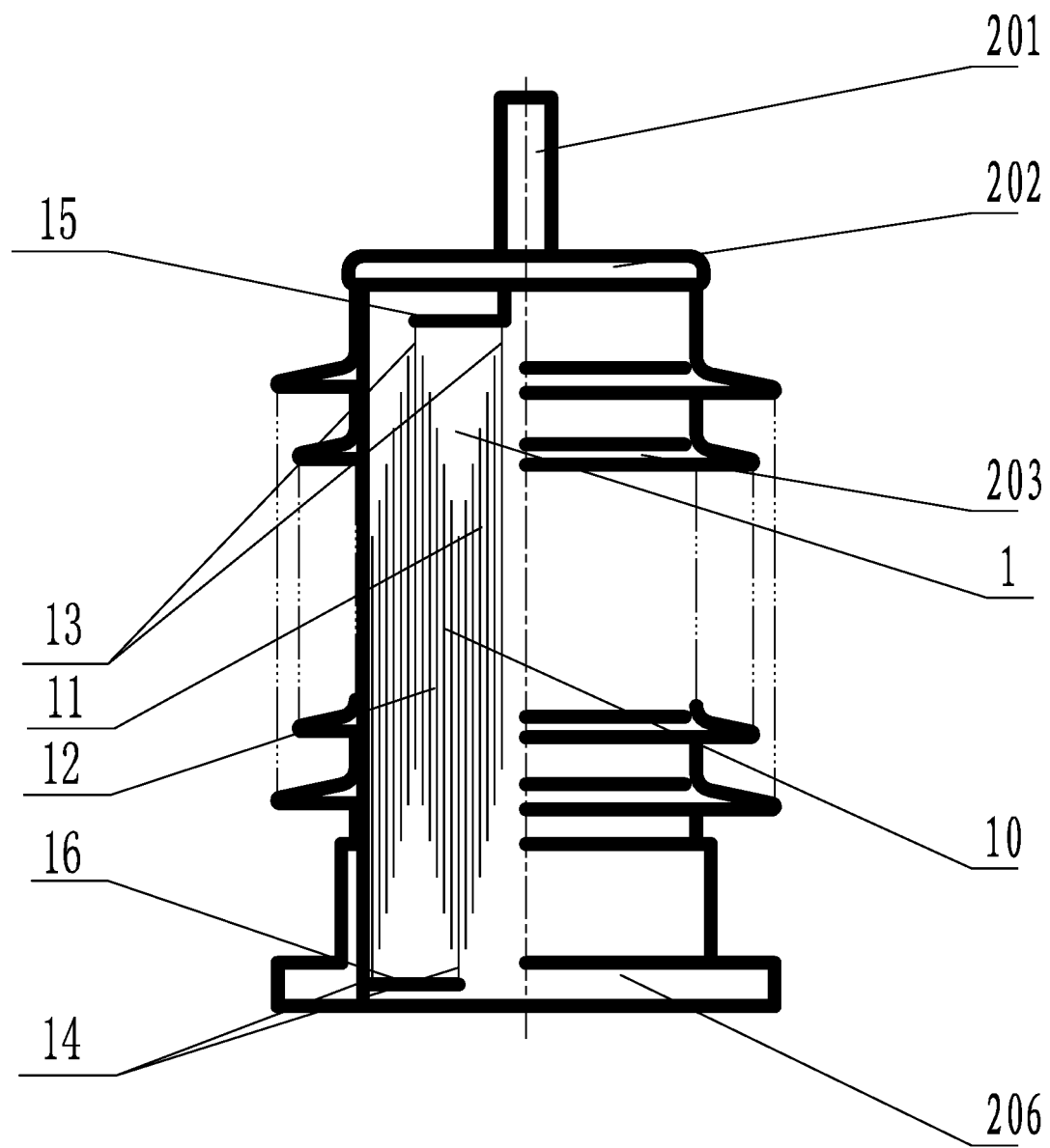
FIG. 4 is schematic diagram illustrating a structure of an embodiment of a high-voltage condenser of the large-capacitance insulating core according to the present invention.

As shown in FIG. 4, a high-voltage condenser with a large-capacitance insulating core can be used in a capacitive voltage transformer or a coupling capacitor, and the high-voltage condenser comprises an insulating core 1, a high-voltage end flange 202 and a low-voltage end flange 206 respectively located at two ends of the insulating core 1, and a silicon rubber shed 203 sleeved outside the insulating core 1. The insulating core 1 of the high-voltage condenser is internally provided with a capacitance increasing structure 10, the capacitance increasing structure 10 is a plurality of capacitive screen sets formed by a forward capacitive screen set 11 and a reverse capacitive screen set 12 that are alternatively arranged and in parallel connection, the forward capacitive screen set 11 comprises a plurality of capacitive screens arranged alternatively with insulating layers, an innermost capacitive screen of the forward capacitive screen set 11 is connected to a high potential, and an outermost capacitive screen is connected to a low potential; the reverse capacitive screen set 12 comprises a plurality of capacitive screens arranged alternatively with insulating layers, an innermost capacitive screen of the reverse capacitive screen set 12 is connected to a low potential, and an outermost capacitive screen is connected to a high potential; and an innermost capacitive screen set and an outermost capacitive screen set in the plurality of capacitive screen sets of the capacitance increasing structure 10 are both the forward capacitive screen sets 11. One end of the low-voltage end flange 206 of the high-voltage condenser can be connected to a low-voltage condenser with much larger capacity than that of the high-voltage condenser, thereby forming a capacitive voltage divider. The capacitive voltage divider can form a main portion of the capacitive voltage transformer. In this way, the low-voltage end flange at a lower end of the condenser can have a lower voltage during operation.

The capacitance increasing structure 10 in the insulating core 1 of the embodiment two is substantially the same as the capacitance increasing structure 10 in the insulating core 1 of the high-voltage bushing of the embodiment one, but only one capacitance increasing structure 10 is provided without needing a current-carrying body, and the capacitance increasing structure 10 is the same as the capacitance increasing structure 10 located in an upper portion of the insulating core 1 of the embodiment one. The capacitance of the insulating core is increased through the plurality of capacitive screen sets formed through the forward capacitive screen set 11 and the reverse capacitive screen set 12 that are alternatively arranged and in parallel connection, which can satisfy the voltage-sharing and large-capacitance requirements of the high-voltage electrical appliance simultaneously.

As shown in FIG. 4, the capacitance increasing structure 10 of the embodiment comprises alternatively arranged forward capacitive screen set 11 and reverse capacitive screen set 12, and the number of alternating times is determined according to the required capacity; and the plurality of capacitive screen sets of the capacitance increasing structure 10 are coaxially and concentrically arranged. The forward capacitive screen set 11 comprises a plurality of capacitive screens alternately arranged with insulating layers, the number and the position of the capacitive screen, and the thickness of the insulating layer between the capacitive screens can be different, and are determined according to application. The innermost capacitive screen in the forward capacitive screen set 11 is a capacitive screen 13 connected to the high potential, and the outermost capacitive screen is a capacitive screen 14 connected to the low potential. The plurality of coaxially and concentrically arranged capacitive screens of the forward capacitive screen set 11 gradually offset from one end of the high potential to one end of the low potential in a ladder-like way through misplacement along an axial direction from inside to outside, so that the voltage is evenly distributed. The reverse capacitive screen set 12 comprises a plurality of capacitive screens alternately arranged with insulating layers, the number and the position of the capacitive screen, and the thickness of the insulating layer between the capacitive screens can be different, and are determined according to application. The innermost capacitive screen in the reverse capacitive screen set 12 is a capacitive screen 14 connected to the low potential, and the outermost capacitive screen is a capacitive screen 13 connected to the high potential. The plurality of coaxially and concentrically arranged capacitive screens of the reverse capacitive screen set 12 gradually offset from low-voltage end to high-voltage end of the insulating core in a ladder-like way through misplacement along an axial direction from inside to outside, so that the electric field is evenly distributed. The capacitive screens in all capacitive screen sets of the capacitance increasing structure 10 connected to the high potential are connected through a high-voltage potential connecting line 15 at a position close to a high-voltage end flange 202 and are electrically connected to a high-voltage potential, and the capacitive screens in all capacitive screen sets of the capacitance increasing structure 10 connected to the low potential are connected through a low potential connecting line 16 at a position close to a low-voltage end flange 206 and are connected to a low potential position, so that all forward capacitive screen sets and reverse capacitive screen sets form a parallel connection structure.

Embodiment Three

Figure 5:
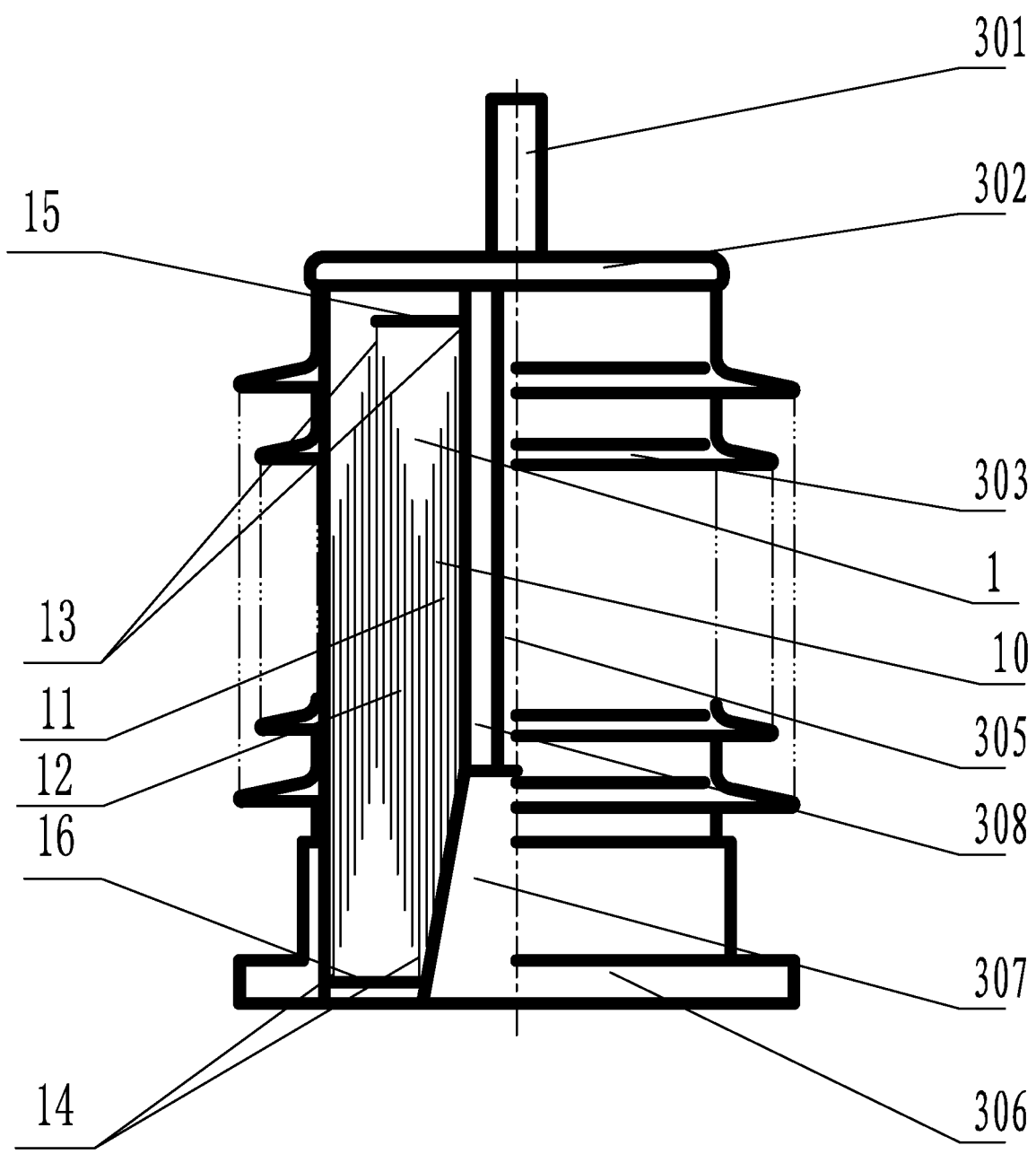
FIG. 5 is schematic diagram illustrating a structure of an embodiment of a cable terminal of the large-capacitance insulating core according to the present invention.

As shown in FIG. 5, regarding to a cable terminal with a large-capacitance insulating core, the cable terminal comprises an insulating core 1, a high-voltage end flange 302 and a grounding flange 306 respectively located at two ends of the insulating core 1, a silicon rubber shed 303 sleeved outside the insulating core 1, and a connecting terminal 301 located at one end of the high-voltage end flange 302; and a cable current-carrying conductor 305 penetrates into the insulating core 1. The insulating core 1 of the cable terminal is internally provided with a capacitance increasing structure 10, the capacitance increasing structure 10 is a plurality of capacitive screen sets formed by a forward capacitive screen set 11 and a reverse capacitive screen set 12 that are alternatively arranged and in parallel connection, the forward capacitive screen set 11 comprises a plurality of capacitive screens arranged alternatively with insulating layers, an innermost capacitive screen of the forward capacitive screen set 11 is connected to a high potential, and an outermost capacitive screen is connected to a low potential; the reverse capacitive screen set 12 comprises a plurality of capacitive screens arranged alternatively with insulating layers, an innermost capacitive screen of the reverse capacitive screen set 12 is connected to a low potential, and an outermost capacitive screen is connected to a high potential; and an innermost capacitive screen set and an outermost capacitive screen set in the plurality of capacitive screen sets of the capacitance increasing structure 10 are both the forward capacitive screen sets 11.

The capacitance increasing structure 10 in the insulating core 1 of the Embodiment three is substantially the same as the capacitance increasing structure 10 in the insulating core 1 of the high-voltage bushing of the embodiment one, but only one capacitance increasing structure 10 is provided, and the capacitance increasing structure 10 is the same as the capacitance increasing structure 10 located in an upper portion of the insulating core 1 of the embodiment one. The capacitance of the insulating core is increased through the plurality of capacitive screen sets formed through the forward capacitive screen set 11 and the reverse capacitive screen set 12 that are alternatively arranged and in parallel connection, which can satisfy the voltage-sharing and large-capacitance requirements of the high-voltage electrical appliance simultaneously. The structures of the forward capacitive screen set 11 and the reverse capacitive screen set 12 of the capacitance increasing structure 10 are the same as the structures of the forward capacitive screen sets 11 and the reverse capacitive screen sets 12 of the first and embodiment twos, which is not described in detail herein.

In addition, an inner surface of the insulating core 1 of the cable terminal of the embodiment is provided with a high-voltage equipotential screen, a cable current-carrying conductor 305 is electrically connected to the high-voltage equipotential screen, and a high-voltage equipotential bin 308 is formed between the high-voltage equipotential screen and the cable current-carrying conductor 305 without needing to be filled with an insulating medium. A stress cone 307 is sleeved on one end of the cable current-carrying conductor 305 close to the grounding flange 306 in the insulating core 1, an inner surface of the insulating core 1 is in tight pressure welding with the stress cone 307, and the high-voltage equipotential screen extends from one end of the high-voltage end flange 302 to a top surface of a stress sleeve. The cable terminal of the embodiment forms the high-voltage equipotential bin between the cable current-carrying conductor and the insulating core, so that a gap between the cable current-carrying conductor and the insulating core does not need to be filled with the insulating medium, and a weight of the product is greatly reduced, the manufacturing cost is reduced, and the production and installation efficiency are improved on the premise of guaranteeing insulating strength, partial discharging amount index and the reliability of performance.

Embodiment Four

Figure 6:
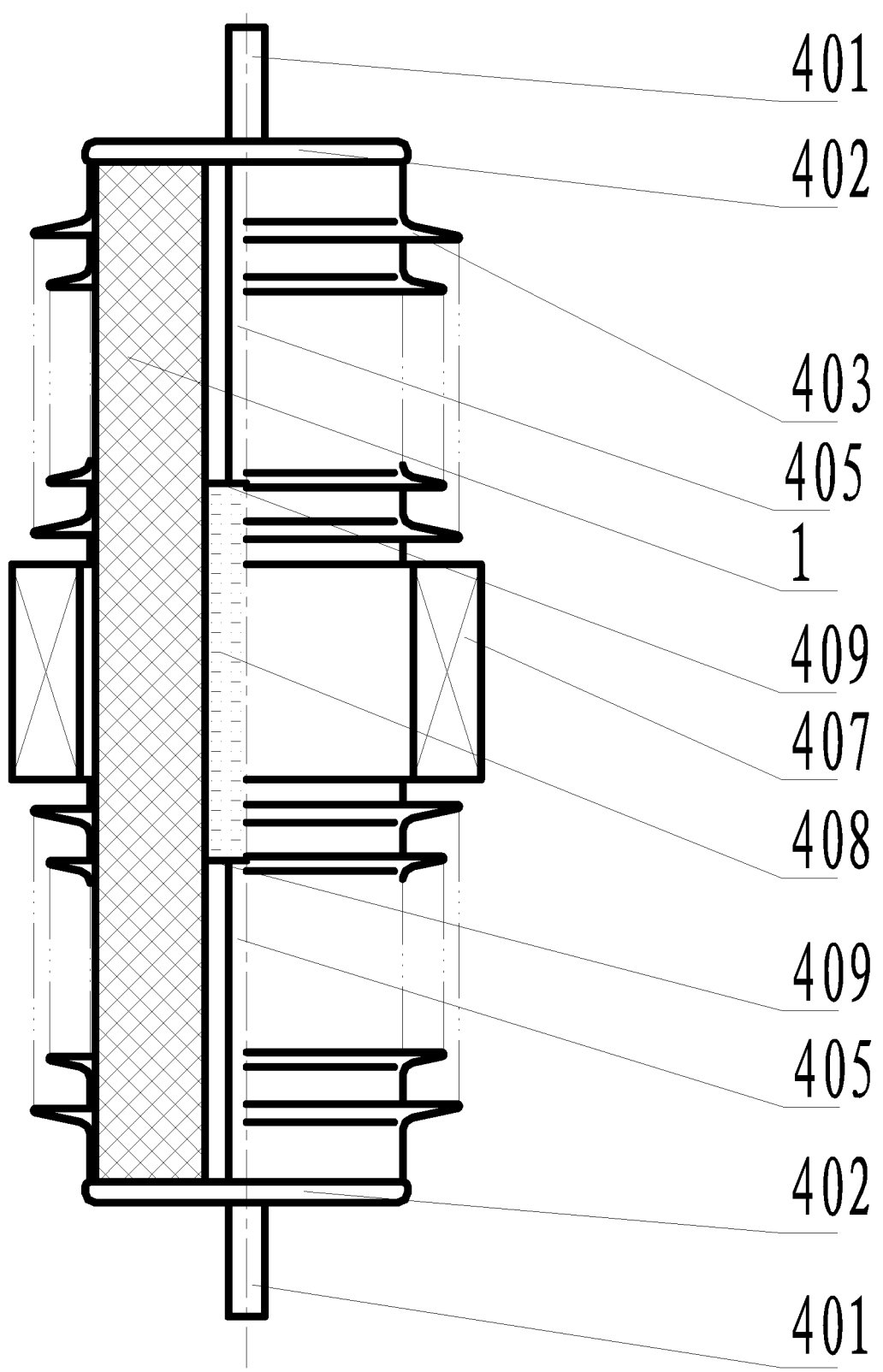
FIG. 6 is schematic diagram illustrating a structure of an embodiment of a multi-functional bushing of the large-capacitance insulating core according to the present invention.
Figure 7:
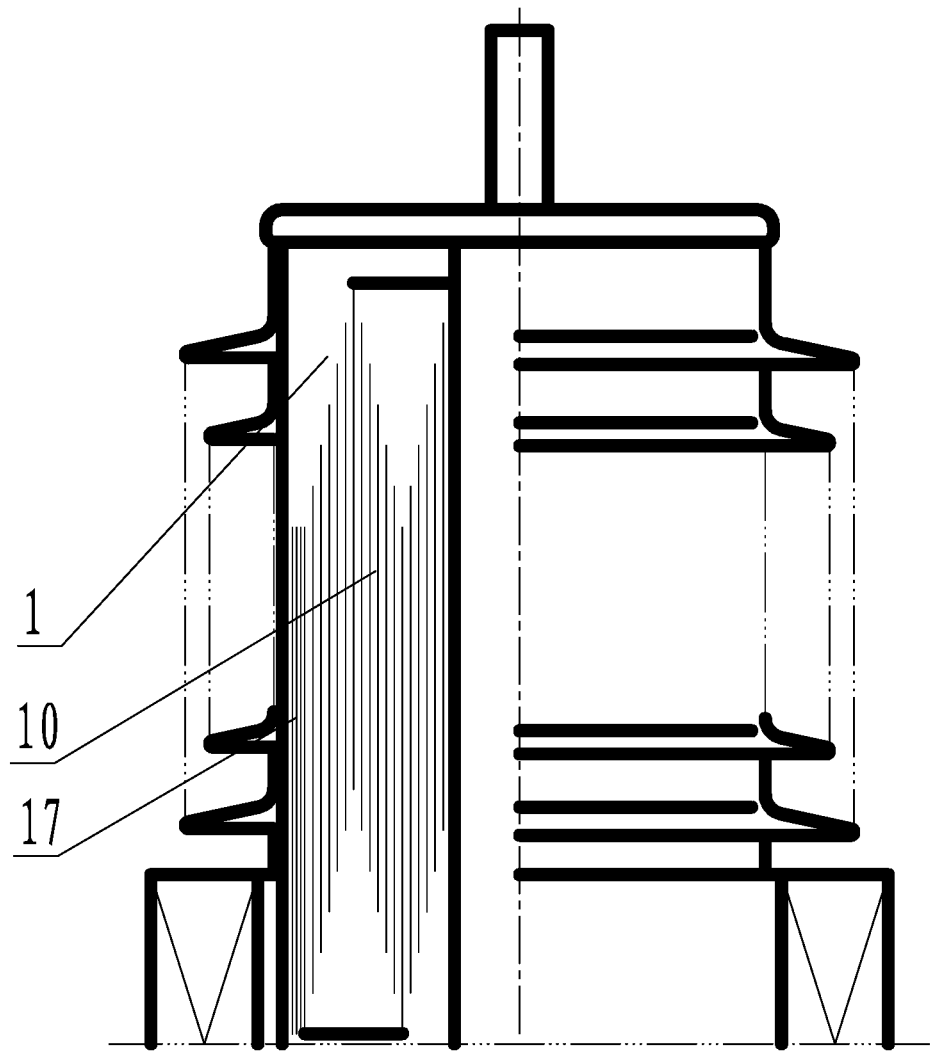
FIG. 7 is a diagram illustrating an internal structure of the insulating core of an upper half part of the multi-functional bushing in FIG. 6.
Figure 8:
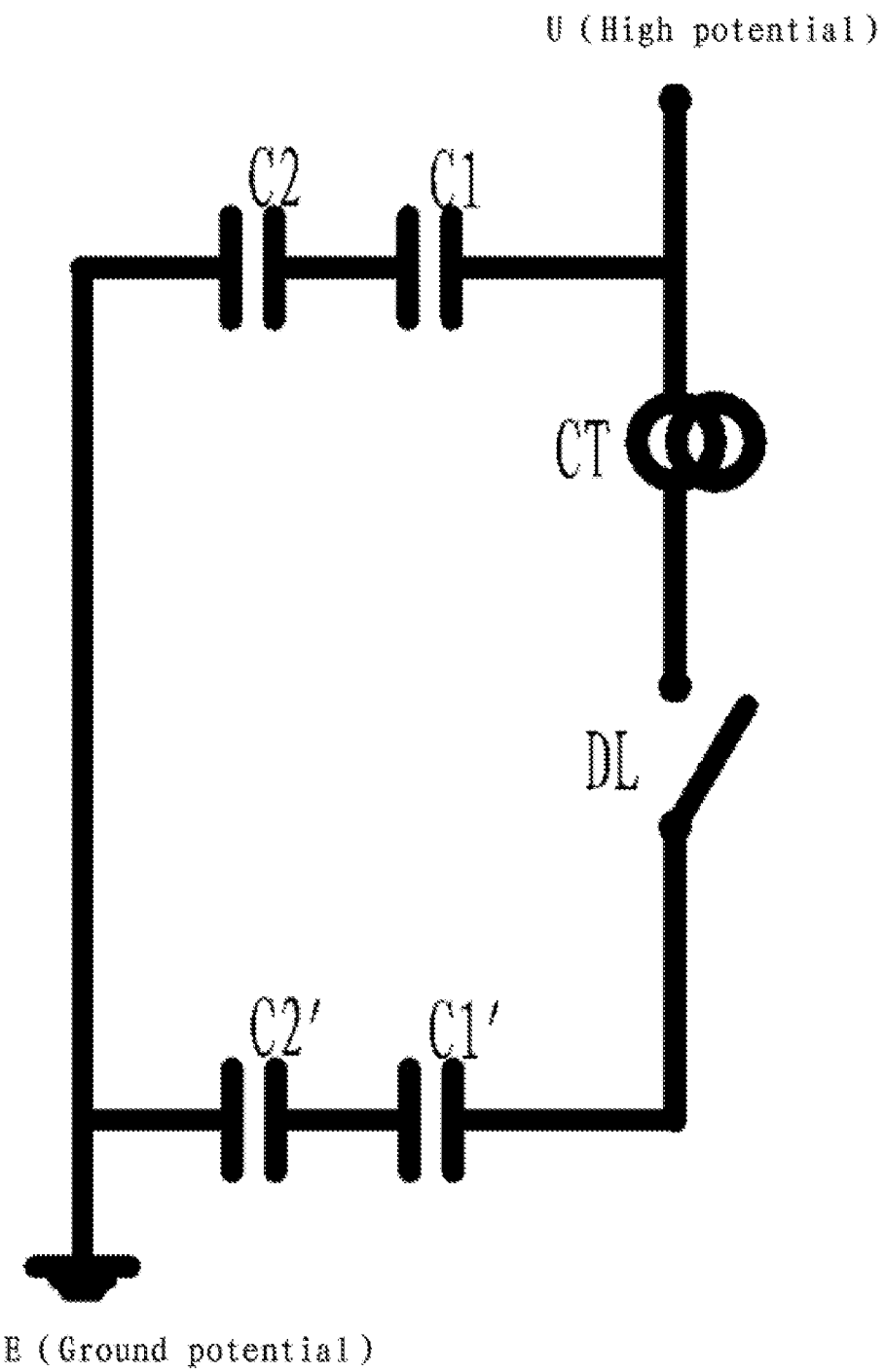
FIG. 8 is a schematic diagram of a circuit of the embodiment in FIG. 6.

As shown in FIGS. 6 to 8, a multi-functional high-voltage bushing with a vacuum interrupter of the present invention comprises a vacuum interrupter 408, an insulating core 1, end flanges 402 arranged at two ends of the insulating core 1, and a silicon rubber shed 403 sleeved outside the insulating core 1; and the vacuum interrupter 408 is covered with the insulating core 1, two connecting terminals 401 are located at two ends of the insulating core 1, the two connecting terminals 401 are electrically connect to a contact in the vacuum interrupter through a current-carrying conductor 405 respectively, an operating mechanism can drive the contacts DL (a moving contact and a stationary contact, or two moving contacts) in the vacuum interrupter to close and break, so as to realize the closing and breaking of a line, and one or a plurality of current transformer secondary coils 407 (current transformer secondary coils CT) are sleeved outside the insulating core 1. As shown in FIG. 7, two capacitance increasing structures 10 are arranged in the insulating core 1, the structures of the two capacitance increasing structures 10 are the same as those in FIG. 1 and the embodiment one, which is not described in detail herein.

The multi-functional high-voltage bushing further comprises a low-voltage voltage-dividing capacitor C2, main capacitors formed by the capacitance increasing structure 10 in the insulating core 1 and the voltage-dividing capacitor C2 form a capacitive voltage divider in series, voltage signal output can be provided by the capacitive voltage divider for measuring the voltage, and meanwhile, sufficient power can further be outputted to supply electricity to the operating mechanism to close or break the connecting terminal. The voltage-dividing capacitor of the multi-functional high-voltage bushing is an independent voltage-dividing capacitor, or a voltage-dividing capacitor embedded in the insulating core or arranged on the multi-functional high-voltage bushing. In the embodiment, the voltage-dividing capacitor C2 is also arranged in the insulating core 1, the voltage-dividing capacitor C2 is composed of a voltage-dividing capacitor screen set 17, the voltage-dividing capacitor screen set 17 comprises a plurality of capacitive screens alternately arranged with insulating layers, the capacitive screen of the voltage-dividing capacitor screen set 17 is sleeved on an outside of the capacitive screen of the capacitance increasing structure 10. Moreover, since the capacitance increasing structure 10 of the present invention is used, the multi-functional high-voltage bushing of the present invention does not need to be provided with a shield capacitor, which simplifies the product structure and reduces the cost.

As shown in FIGS. 6 to 8, the insulating core 1 of the multi-functional high-voltage bushing of the present embodiment is internally provided with two capacitance increasing structures 10 and two voltage-dividing capacitor screen sets 17, the two capacitance increasing structures 10 are symmetrically arranged at two ends of the insulating core 1, the two voltage-dividing capacitor screen sets 17 are respectively located at outsides of the two capacitance increasing structures 10, the two capacitance increasing structures 10 form two main capacitors C1 and C1', the two voltage-dividing capacitor screen sets 17 form two voltage-dividing capacitors C2 and C2', which are connected according to a schematic diagram of a circuit shown in FIG. 8, the main capacitor C1 and the voltage-dividing capacitor C2 form a capacitive voltage divider in series, the main capacitor C1' and the voltage-dividing capacitor C2' form a capacitive voltage divider, a symmetrical structure is applied, and the voltage can be measured and the power can be taken regardless of which end of the connecting terminal is charged.

As shown in FIG. 6, the vacuum interrupter 408 of the embodiment is arranged in a middle portion of a cavity body of the insulating core 1, two ends of the vacuum interrupter 408 are provided with explosion chamber flanges 409, the two capacitance increasing structures 10 are respectively embedded in the two ends of the insulating core 1 to surround the positions of two explosion chamber flanges 409, and each capacitive screen in each capacitance increasing structure 10 surrounds a corresponding explosion chamber flange 409 to realize voltage-sharing protection; and the current transformer secondary coil CT, i.e., the current transformer secondary coil 407, is sleeved outside the insulating core 1 at a position corresponding to the vacuum interrupter 408.

The multi-functional high-voltage bushing with the vacuum interrupter of the present invention not only has a bushing function but also has a circuit breaker function, the insulating core of the bushing is internally provided with the vacuum interrupter to switch on and off the line, which can simplify the structures of a high-voltage switch and a control cabinet, reduce the size of the equipment and reduce the cost of the equipment. The vacuum interrupter is arranged in a bushing with a capacitive screen structure, the connecting terminals are installed at two ends, and the function of the circuit breaker is realized through the operating mechanism and other components; and the multi-functional high-voltage bushing can not only provide the voltage-dividing signal output for measuring the voltage, but also output sufficient power to supply electricity to the operating mechanism, without needing to install any other power supply devices, which simplifies the structures of the high-voltage switch and the control cabinet, reduces the equipment volume, and reduces the cost of equipment.

The capacitance of existing insulating core is too small, the insulating core forming a capacitive voltage divider with the voltage-dividing voltage can meet the requirement of providing a voltage signal for measurement, but since the capacitance is too small and the output power is too low, the requirement of supplying electricity for driving the operating mechanism or others cannot be met. The large-capacitance insulating core of the present invention can satisfy the voltage-sharing and large-capacitance requirements simultaneously, and can be used for obtaining electric energy by high voltage, with the advantages of low cost and high anti-interference performance, and the larger the capacitance of the insulating core is, the higher the electric energy obtained from a high-voltage end is, and the wider the application range is.

The content above is further detailed description to the present invention with reference to specific preferred embodiments, and it cannot be assumed that the specific implementation of the present invention is limited to these descriptions. For those skilled in the art to which the present invention belongs, several simple deductions or substitutions can be made without departing from the concept of the present invention, and shall all be considered as falling within the protection scope of the present invention.

The invention claimed is:

1. A large-capacitance insulating core, wherein:
   the insulating core is internally provided with a capacitance increasing structure, the capacitance increasing structure is a plurality of capacitive screen sets formed by a forward capacitive screen set and a reverse capacitive screen set that are alternatively arranged and in parallel connection;
   the forward capacitive screen set comprises a plurality of capacitive screens arranged alternatively with insulating layers, an innermost capacitive screen of the forward capacitive screen set is connected to a high potential, and an outermost capacitive screen is connected to a low potential;
   the reverse capacitive screen set comprises a plurality of capacitive screens arranged alternatively with insulating layers, an innermost capacitive screen of the reverse capacitive screen set is connected to a low potential, and an outermost capacitive screen is connected to a high potential; and
   an innermost capacitive screen set and an outermost capacitive screen set in the plurality of capacitive screen sets of the capacitance increasing structure are both the forward capacitive screen sets.

2. The large-capacitance insulating core according to claim 1, wherein:
   the plurality of capacitive screen sets of the capacitance increasing structure are coaxially and concentrically arranged, and the plurality of capacitive screens of the forward capacitive screen set and the plurality of capacitive screens of the reverse capacitive screen set are all cylinders that are coaxially and concentrically arranged.

3. The large-capacitance insulating core according to claim 1, wherein:
   the capacitive screens in all capacitive screen sets of the capacitance increasing structure connected to the high potential are electrically connected to each other, and the capacitive screens in all capacitive screen sets of the capacitance increasing structure connected to the low potential are electrically connected to each other.

4. The large-capacitance insulating core according to claim 1, wherein:
   the plurality of coaxially and concentrically arranged capacitive screens of the forward capacitive screen set gradually offset from one end to the other end of the insulating core in a ladder-like way along an axial direction from inside to outside; and
   the plurality of coaxially and concentrically arranged capacitive screens of the reverse capacitive screen set gradually offset from the other end to one end of the insulating core in a ladder-like way along an axial direction from inside to outside.

5. The large-capacitance insulating core according to claim 1, wherein:
   one or a plurality of capacitance increasing structures are arranged in an axial direction of the insulating core.

6. The large-capacitance insulating core according to claim 1, wherein:
   the insulating core is provided with a grounding flange, two capacitance increasing structures are arranged in an axial direction of the insulating core, and the two capacitance increasing structures are respectively located on two sides of the grounding flange; and
   the plurality of capacitive screen sets of the two capacitance increasing structures are also in parallel connection with each other.

7. A high-voltage electrical appliance, comprising the insulating core according to claim 1.

8. The high-voltage electrical appliance according to claim 6, wherein:
the capacitance increasing structure of the insulating core forms a main capacitor, the high-voltage electrical appliance further comprises a voltage-dividing capacitor, the main capacitor and the voltage-dividing capacitor form a capacitive voltage divider in series.

9. The high-voltage electrical appliance according to claim 7, wherein:
the high-voltage electrical appliance is a transformer bushing, a wall bushing, a cable terminal, a voltage transformer, a current transformer, a coupling capacitors or an insulated busbar.

10. A multi-functional high-voltage bushing, comprising a vacuum interrupter, wherein:
the vacuum interrupter is covered with the insulating core according to claim 1, two connecting terminals are located at two ends of the insulating core, the two connecting terminals are electrically connected to a contact in the vacuum interrupter respectively, an operating mechanism can drive the contact in the vacuum interrupter to close and break, so as to realize the closing and breaking of a line; and
the multi-functional high-voltage bushing further comprises a voltage-dividing capacitor, main capacitors formed by a capacitance increasing structure in the insulating core and the voltage-dividing capacitor form a capacitive voltage divider in series, and the capacitive voltage divider is used to supply power to the operating mechanism.

* * * * *